(12) United States Patent
Miida

(10) Patent No.: US 6,950,134 B2
(45) Date of Patent: Sep. 27, 2005

(54) METHOD OF PREVENTING TRANSFER AND STORAGE OF NON-OPTICALLY GENERATED CHARGES IN SOLID STATE IMAGING DEVICE

(75) Inventor: Takashi Miida, Kanagawa (JP)

(73) Assignee: Innotech Corporation (JP)

(*) Notice: Subject to any disclaimer, the term of this patent is extended or adjusted under 35 U.S.C. 154(b) by 953 days.

(21) Appl. No.: 09/774,667

(22) Filed: Feb. 1, 2001

(65) Prior Publication Data

US 2001/0015468 A1 Aug. 23, 2001

(30) Foreign Application Priority Data

| Feb. 22, 2000 | (JP) | 2000-044886 |
| Aug. 4, 2000 | (JP) | 2000-237521 |
| Aug. 15, 2000 | (JP) | 2000-246416 |
| Sep. 26, 2000 | (JP) | 2000-292786 |

(51) Int. Cl.[7] .............................................. H04N 3/14
(52) U.S. Cl. ..................... 348/294; 257/292; 250/208.1
(58) Field of Search ................................ 348/294, 298, 348/300, 301, 308; 250/208.1; 257/292

(56) References Cited

U.S. PATENT DOCUMENTS

| 4,630,091 A | * 12/1986 | Kuroda et al. ............... 257/446 |
| 4,901,129 A | 2/1990 | Hynecek ....................... 357/30 |
| 5,317,174 A | 5/1994 | Hynecek ....................... 257/222 |
| 5,430,312 A | 7/1995 | Yamada ........................ 257/291 |
| 5,808,333 A | * 9/1998 | Maruyama et al. .......... 257/290 |
| 6,051,857 A | 4/2000 | Miida ........................... 257/292 |

FOREIGN PATENT DOCUMENTS

| EP | 0 978 878 A2 | 11/1998 |
| JP | 60-140752 | 7/1985 |
| JP | 60-206063 | 10/1985 |
| JP | 2-304973 | 12/1990 |
| JP | 8-236741 | 9/1996 |
| JP | 11-195778 | 7/1999 |
| JP | 11195778 | * 7/1999 ......... H01L/27/146 |

OTHER PUBLICATIONS

IEEE, vol. 38, No. 5, May 1991, pp. 1011–1020.

* cited by examiner

Primary Examiner—David L. Ometz
Assistant Examiner—Gevell Selby
(74) Attorney, Agent, or Firm—Lorusso & Loud

(57) ABSTRACT

Disclosed is a method of storing optically generated charges by an optical signal in a solid state imaging device, which is particularly a method of storing optically generated charges by an optical signal in a solid state imaging device using a MOS image sensor of a threshold voltage modulation type, which is used for a video camera, an electronic camera, an image input camera, a scanner, a facsimile or the like. The method comprises the steps of preparing a solid state imaging device having a unit pixel including a photo diode 111 and a MOSFET 112, the MOSFET 112 having a carrier pocket 25 for storing optically generated charges generated in the photo diode 111, the carrier pocket 25 being provided under a channel region 15c in the vicinity of a source region 16, transferring the optically generated charges to the carrier pocket 25 and then storing them therein while maintaining the channel region 15c in an accumulation state such that the optically generated charges are not affected by interface levels in the channel region 15c.

10 Claims, 8 Drawing Sheets

Period A

Vpg = 2.5V
Vps = 1.6V

Vpd = 1.6V

Period B

Vpg = 0V
Vps = 0V

Vpd = 3.3V

Period C

Vpg = 2V
Vps = Vth

Vpd = 3.3V

METHOD OF PREVENTING TRANSFER AND STORAGE OF NON-OPTICALLY GENERATED CHARGES IN SOLID STATE IMAGING DEVICE

BACKGROUND OF THE INVENTION

1. Field of the Invention

The present invention relates to a method of storing optically generated charges by an optical signal in a solid state imaging device using a MOS image sensor of a threshold voltage modulation type, which is used for a video camera, an electronic camera, an image input camera, a scanner, a facsimile or the like.

2. Description of the Prior Art

Since a semiconductor image sensor such as a CCD image sensor and a MOS image sensor is excellent in mass productivity, the semiconductor image sensor has been applied to almost all types of image input devices accompanied with the progress in a fine pattern technology.

Particularly, in recent years, the applicability of the MOS image sensor has been recognized again because of the advantages thereof, i.e., smaller power consumption compared with that of the CCD image sensor, and the capability of making a sensor element and a peripheral circuit element by the same CMOS technology.

In consideration of such a social trend, the present inventor has improved the MOS image sensor, and filed a patent application (Japanese Paten Application No. Hei 10-186453) regarding a sensor element having a carrier pocket (high-density buried layer) 25 under a channel region of an insulated gate field effect transistor for optical signal detection (hereinafter, referred to as a MOSFET for optical signal detection or simply as a MOSFET in some cases) to obtain a patent thereof (Registered Number 2935492).

The above-described MOS image sensor has a circuit constitution shown in FIG.8(a) of the patent (Registered Number 2935492). A series of operations of the MOS image sensor are made to pass through a storing period, a reading-out period and an initializing period as shown in FIG. 8(b). During the storing period, optically generated holes are generated by light irradiation and then stored in a hole pocket 25. During the reading-out period, an optical signal proportional to the storage amount of the optically generated holes is detected. Then, during the initializing period, a high reverse voltage is applied to each electrode, i.e. gate, source and drain, and optically generated holes stored in the hole pocket 25 are discharged to perfectly deplete a hole storage region.

The present inventor has filed various novel applications related to the invention according to the patent (Registered Number 2935492). According to these applications, as shown in FIG. 8 of this application, during the storing period, a potential of a gate electrode (Vpg (VSCAN)) is set to be a low voltage, that is, a ground potential in general, and a drain potential (Vpd) and a source potential (Vps) are set to be higher than the gate potential, that is, about 3.3 V in many cases. A depletion n-channel MOSFET for optical signal detection is made to maintain a cutoff state (depletion state) in the above-described manner, and then optically generated charges generated in a photo diode are transferred to the carrier pocket 25 under the channel region.

However, during the foregoing storing period, carriers of the same type as the optically generated charges may be sometimes discharged from levels on an interface between a gate insulating film and the channel region. In this case, the carriers discharged from the interface levels flow into the carrier pocket 25 to be a leak current. Therefore, holes other than the optically generated charges are stored in the carrier pocket 25.

In such a case, if making patterns finer for increasing a photosensitivity, a large amount of holes are stored in the carrier pocket 25 even by a little leak current that has not conventionally brought a problem, thus there is a fear of causing a problem that a bright luminance line, that is, a so-called white scratch, is generated on an image screen.

Alternatively, even if only the optically generated charges, which are not generated by a leak current, are normally stored in the carrier pocket 25, there may be some cases where excessive optically generated charges than necessary are stored therein.

In this case, a non-selected unit pixel (cell) (Vpg=0) comes into a deep depletion state by the excessively stored optically generated charges, thus raising a source potential. On the other hand, in a selected cell, in the case where the stored charges are at a low level, the source potential is lowered, and a margin of the selection and discrimination is reduced, thus causing worsening of a so-called smear characteristic, that is, generation of a bright band with striped-shape in a perpendicular direction on the image screen.

SUMMARY OF THE INVENTION

The object of the present invention is to provide a method of storing optically generated charges by an optical signal in a solid state imaging device, which is capable of preventing generation of a so-called white scratch caused by a leak current due to a discharge of electrons from interface levels between a gate insulating film and a channel region, and of preventing generation of a smear caused by excessively stored optically generated charges.

The present invention is directed to the method of storing optically generated charges by an optical signal in a solid state imaging device. A basic constitution of the solid state imaging device for use in the method of storing optically generated charges by an optical signal comprises a unit pixel including a photo diode and an insulated gate field effect transistor for optical signal detection (hereinafter, the insulated gate field effect transistor is referred to as a MOS transistor for optical signal detection or simply as a MOSFET, and in some cases, a term "depletion" may be added to the heads of these abbreviations.) placed adjacently to the photo diode, in which, in the unit pixel, the photo diode and the MOSFET are formed respectively in well regions and connected to each other, and an impurity region of the photo diode and a drain region of the MOSFET are connected to each other, and the carrier pocket storing the optically generated charges is provided in the well region in a peripheral portion of a source region of the MOSFET.

In the present invention, the optically generated charges generated by light irradiation in the photo diode are transferred to the carrier pocket. During a storing period A, the channel region of the depletion MOSFET is filled with movable carriers of the same conductivity type as that of the source region (set in an accumulation state), and while preventing a discharge of free charge carrier from interface levels on the channel region, the optically generated charges are transferred to the carrier pocket. During a terminating period B of the storing period, the channel region is set in a depletion state, a stronger electric field than enough strength to direct the optically generated charges from the photo diode 111 to the carrier pocket is formed to further transfer the remaining optically generated charges to the carrier pocket and make them store therein.

For example, during the period A when the optically generated charges are transferred to the carrier pocket and stored therein, a gate electrode is held at a positive potential (for example, 2.0 V), and the source region and the drain region is held at a positive potential lower than the positive potential of the gate electrode (for example, 1.6 V). In other words, in the case of p-type well region 15b, sufficient charges (electrons) are induced in the channel region, and thus the channel region is set in an accumulation state.

Thus, hole generating centers on the interface levels on the channel region are maintained in a non-active state, and the discharge of the charges (holes) trapped on the interface levels is prevented. In other words, since the leak current is not generated, the storage of the holes other than the optically generated charges is suppressed, thus the generation of a so-called white scratch on the image screen can be prevented.

Moreover, while the potential of the gate electrode being set such that the channel region is set in an accumulation state, the potentials of the drain region and the source region are changed. Such applied potentials to the electrode and the regions raises a potential on the surface of the well region, thus a potential difference between a bottom of the potential of the carrier pocket and a top thereof can be set lower. Particularly, by appropriately adjusting the potentials of the source electrode and the drain electrode, the potential of the carrier pocket is set at an appropriate height while the channel region is maintained in the accumulation state. Therefore, during the foregoing period A, the excessive optically generated charges are made to overflow the carrier pocket, and an amount of the optically generated charges stored in the carrier pocket is appropriately maintained, thus preventing a so-called smear.

Noted that, during the terminating period B when the optically generated charges are transferred to the carrier pocket and stored therein, the gate electrode is held at a positive voltage (0 V) that is lower than the positive potential of the gate electrode during the period A, and the drain region is held at a positive voltage (for example, 3.3 V) that is higher than the positive potential of the drain region. Thus, the channel region can be set in a depletion state, a stronger electric field than an enough electric field to move the optically generated charges from a light receiving portion to the carrier pocket can be formed in the well regions, and the remaining optically generated charges can be stored in the carrier pocket without any leavings.

The occurrence of a so-called white scratch and other problems caused by a leakage current on the video screen can be prevented more perfectly through the following constitutions.

The photo diode is formed in the well region which serves as a charge generation region generating optically generated charges and as a charge transfer region to the carrier pocket. In the photo diode, the impurity region of the second conductivity type is formed on the well region of the first conductivity type and thus the photo diode has a so-called buried structure to the optically generated charges. The buried structure is defined as a structure such that the well region is not apparent on a surface of a semiconductor substrate. Such buried structure results in preventing the optically generated charges in the photo diode from being captured into interface levels on the channel region. Or it results in suppressing a discharge of charges other than the optically generated charges out of the interface levels on the channel region.

The field effect transistor for optical signal detection has a drain region extending on the well region from the impurity region and being formed as one body with the impurity region. During transferring charge carriers of the first conductivity type generated on the photo diode to the carrier pocket, and during storing the optically generated charges in the carrier pocket, a potential of the gate electrode is maintained so as to form the accumulation state such that the channel doped layer is filled with major charge carriers of the second conductivity type. As a result, since a region from the charge generation region to the carrier pocket via the charge transfer region has the buried structure to the optically generated charges, the optically generated charges in the photo diode are prevented from being captured into surface levels on the channel region, or charges other than the optically generated charges are prevented from being discharged out of the interface levels on the channel region and from being stored in the carrier pocket.

Further, movable charges of the second conductivity type may be accumulated in a surface layer over the entire well regions. As a result, the optically generated charges in the photo diode are more perfectly prevented from being captured in the interface levels over the entire well regions including the charge generation region, the charge transfer region and the other region, or charges other than the optically generated charges are more perfectly prevented from being discharged out of the interface levels over the entire well regions.

Note that, in the case where the well region and the like are a conductive type reverse to the foregoing, that is, in the case where the well regions and the carrier pocket are of an n-type, the carrier pocket becomes an electron pocket (carrier pocket), and stores the optically generated charges. In this case, the depletion p-channel MOSFET (depletion pMOSFET) is used as a MOSFET for optical signal detection, sufficient charges (holes) are induced and accumulated into the channel region, the discharge of the charges (electrons) trapped on the interface levels on the channel region is prevented, and the potential in the carrier pocket is set at an appropriate height.

BRIEF DESCRIPTION OF THE DRAWINGS

For a more complete understanding of the present invention and the advantages thereof, reference is now made to the following description taken in conjunction with the accompanying drawings.

DESCRIPTION OF THE PREFERRED EMBODIMENTS

An embodiment of the present invention will be described with reference to the accompanying drawings below.

First, description will be made below for a constitution of a unit pixel of a MOS image sensor for use in a method of storing optically generated charges by an optical signal in a solid state imaging device according to the embodiment of the present invention.

Figure 8:
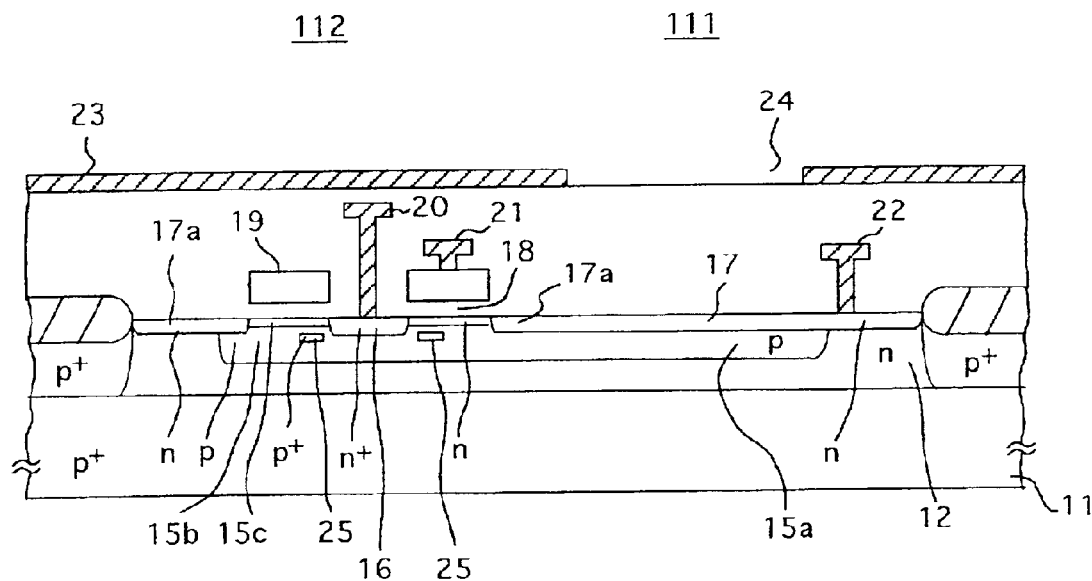
FIG. 8 is a cross-sectional view showing a solid state imaging device for use in the method of storing optically generated charges by an optical signal according to the embodiment of the present invention.

FIG. 8 is a cross-sectional view of an element in the unit pixel of the MOS image sensor.

As shown in FIG. 8, in a unit pixel 101, a photo diode 111 and a MOSFET 112 for optical signal detection are provided adjacently to each other. For the MOSFET 112, a depletion n-channel MOSFET (depletion nMOSFET) is employed.

The cross-sectional constitution of this unit pixel 101 is, sequentially from the lower, a p-type substrate 11, an n-type epitaxial layer 12 formed on the substrate 11, and first and second p-type well regions 15a and 15b formed in the epitaxial layer 12.

The photo diode 111 and the MOSFET 112 are respectively formed in the a first and a second well regions 15a and 15b, and the first and second well regions 15a and 15b are connected to each other.

The first well region 15a of the photo diode 111 constitutes a part of a charge generation region by light irradiation. The second well region 15b of the MOSFET 112 constitutes a gate region capable of changing a threshold voltage of a channel by a potential applied to the second well region 15b.

In the photo diode 111, since the first well region 15a and the epitaxial layer 12 are connected to the gate region 15b of the MOSFET 112, holes among charges generated by lights can be used effectively as charges for threshold voltage modulation of the MOSFET 112. In other words, the first well region 15a and the epitaxial layer 12 become entirely the carrier generation region.

In the MOSFET 112 portion, the gate electrode 19 is ring-shaped. A source region 16 is formed so as to be surrounded with the inner periphery of the ring-shaped gate electrode 19, while a drain region 17a is formed so as to surround the outer peripheral portion of the ring-shaped gate electrode 19. The drain region 17a is extended to form an n-type impurity region 17 of the photo diode 111. In other words, the impurity region 17 and the drain region 17a are integrally formed with each other such that most regions thereof can be placed in contact with surface layers of the first and second well regions 15a and 15b.

A surface layer of the second well region 15b between the drain region 17a and the source region 16 becomes an n-channel region (hereinafter, simply referred to as a channel region in some cases). Further, in order to maintain the channel region in an electron storing or depletion state at a usual operation voltage, n-type impurities having a proper density are introduced to the channel region to form a channel doped layer 15c. The gate electrode 19 is formed on the channel region by interpolating a gate insulating film 18.

A p+-type carrier pocket (high-density buried layer) 25 is formed in a part of the region in the channel-length direction in the second well region 15b below the n-channel region, and across the entire region in the channel-width direction, i.e., in the peripheral portion of the source region 16 so as to surround the source region 16. The carrier pocket 25 is formed in the second well region 15b under the channel region.

An impurity density of the foregoing p+-type carrier pocket 25 is set higher than that of the well regions 15a and 15b in the peripheral portion of the carrier pocket. Therefore, a potential in the carrier pocket 25 is lower than a potential in the peripheral portion of the carrier pocket 25 for optically generated holes among optically generated charges. Accordingly, the optically generated holes can be collected in the carrier pocket 25.

As described above, the solid state imaging device applying the present invention has a buried structure to the optically generated charges over the entire well regions 15a and 15b including the charge-generating region, the charge-transferring region and the charge-storage region and the other region except for the channel dope layer 15c. Thus, during generating the optically generated charges, transferring them and storing them in the carrier pocket 25 as described below, the optically generated charges as described above are more perfectly prevented from being captured in the surface levels, or charges other than the optically generated charges are more perfectly prevented from being discharged out of the surface levels and from being stored in the carrier pocket 25 by forming the accumulation state of electrons over a resultant entire surface layer of the well regions 15a and 15b through transforming the channel dope layer 15c to an accumulation state of electrons upon applying a voltage to the gate electrode 19 and so on.

Though the accumulation state of electrons is formed over entire surface layer of the well regions 15a and 15b except for the channel dope layer 15c, a so-called buried layer may be formed at least in the photo diode 111 when occasion demands.

Figure 7:
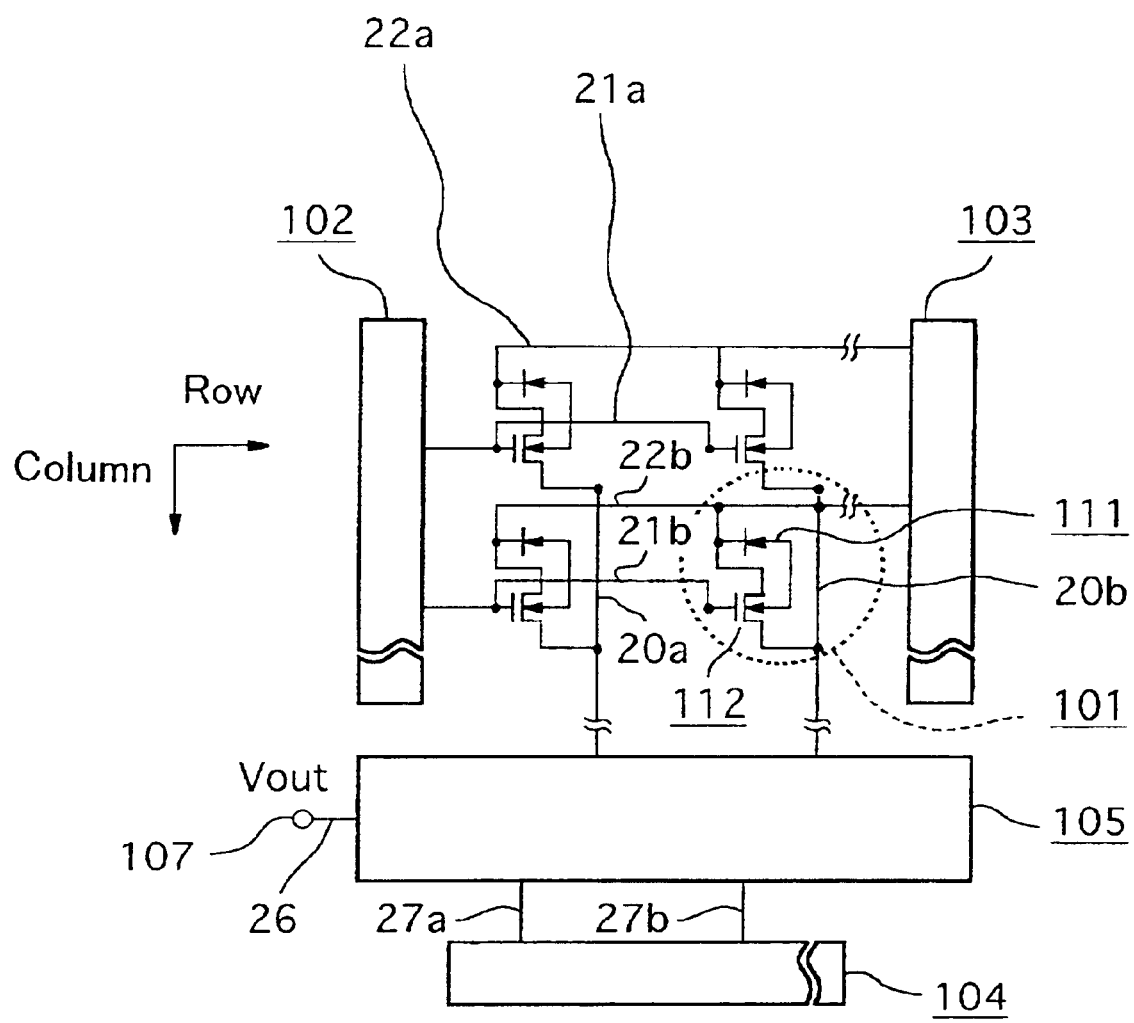
FIG. 7 is a view showing a circuit constitution of an entire solid state imaging device for use in the method of storing optically generated charges by an optical signal in a solid state imaging device according to the embodiment of the present invention.

Next, description will be made for the entire constitution of the MOS image sensor employing the unit pixel structured in the foregoing manner by referring to FIG. 7. FIG. 7 shows a circuit constitution of the MOS image sensor according to the embodiment of the present invention.

As shown in FIG. 7, this MOS image sensor employs the constitution of a two-dimensional array sensor, and the unit pixels 101 structured in the foregoing manner are arrayed in row and column directions in a matrix shape.

A driving scanning circuit 102 for a vertical scanning signal (VSCAN) and a driving scanning circuit 103 for a drain voltage (VDD) are arranged right and left sandwiching a pixel region.

Vertical scanning signal supply lines 21a and 21b are drawn out, one for each row, from the driving scanning circuit 102 for the vertical scanning signal (VSCAN). The vertical scanning signal supply lines 21a and 21b are connected to the gate electrode 19 of the MOSFET 112 in each of all the pixels 101 arrayed in the row direction.

Drain voltage supply lines (VDD supply lines) 22a and 22b are drawn out, one for each row, from the driving scanning circuit 103 for the drain voltage (VDD). Each of the drain voltage supply lines (VDD supply lines) 22a and 22b is connected to the drain region 17a of the MOSFET 112 for optical signal detection in each of all the pixels 101 arrayed in the row direction.

Vertical output lines 20a and 20b different for each column are provided. Each of these vertical output lines 20a and 20b is connected to the source region 16 of the MOSFET 112 in each of all the pixels 101 arrayed in the column direction.

In addition, the source region 16 of the MOSFET 112 is connected, for each column, to a signal output circuit 105 through the vertical output lines 20a and 20b. The signal output circuit 105 stores a potential of the source region 16, and further, outputs a video signal corresponding to the potential of the source region 16 through a horizontal output line 26 to a video signal output terminal 107. An HSCAN input scanning circuit 104 controls a timing of the output.

Next, description will be made for a series of successive photodetecting operations of the solid state imaging device comprised in the embodiment of the present invention.

Figure 2:
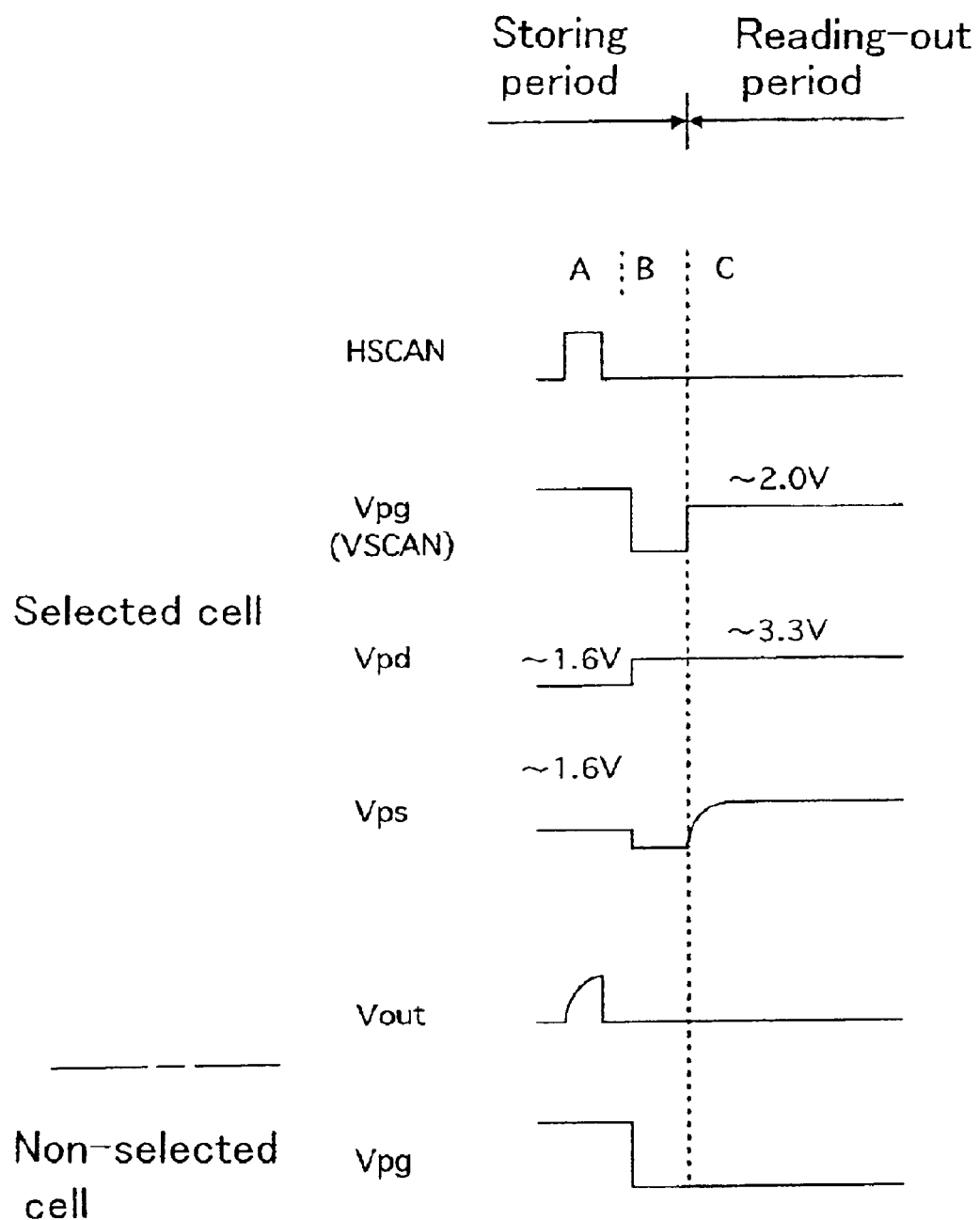
FIG. 2 is a timing chart showing a method of storing optically generated charges by an optical signal in a solid state imaging device according to an embodiment of the present invention.

FIG. 2 shows a timing chart of the input/output signals for operating the MOS image sensor according to the present invention.

The photodetecting operation is carried out by repeating, as described above, a series of periods including storing, reading-out, and sweeping (initializing). The storing period is a period for storing the optically generated charges generated by light irradiation in the carrier pocket 25. The reading-out period is a period for reading out modulation of the threshold voltage corresponding to the optically generated charges stored in the carrier pocket 25. The initializing period is a period for discharging the optically generated charges remaining in the carrier pocket 25.

Herein, description will be made in detail, mainly for the storing period (period A and period B) and the reading-out period (period C) that follows the storing period. The period B among the storing period is a period for terminating the storing period, the period B following the period A.

Figure 3A:
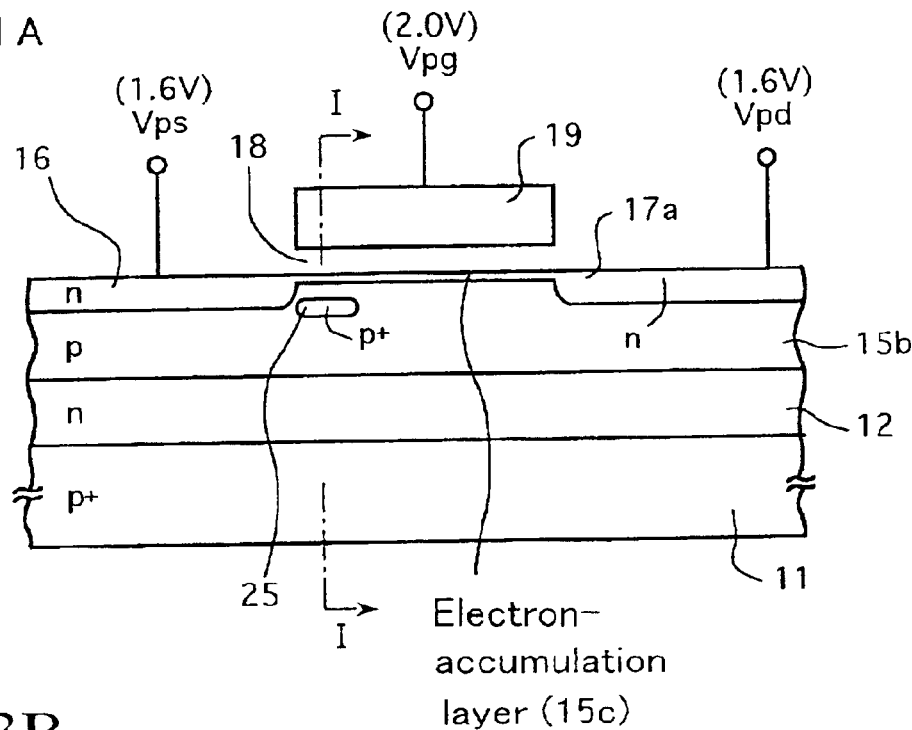
FIG. 3A is a cross-sectional view showing a state of a peripheral portion of a channel region during a period A of a storing period in the method of storing optically generated charges by an optical signal in FIG. 2A.

FIG. 3A is a cross-sectional view showing a state of the channel region of the MOSFET portion and a peripheral portion thereof during the period A of FIG. 2 according to the present invention.

Figure 4A:
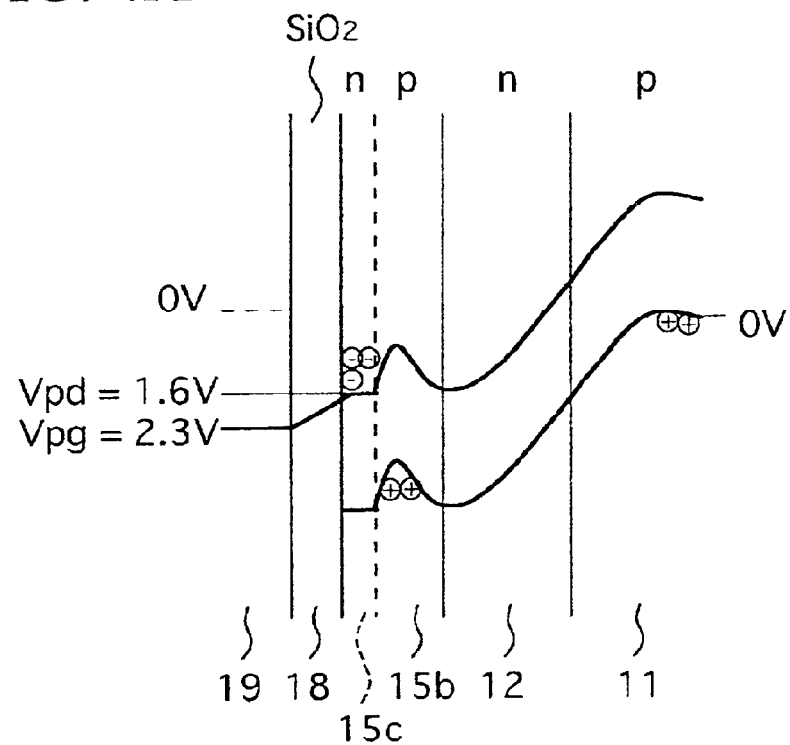
FIG. 4A is a graph showing a state of a change in an energy band of a depth direction, the graph corresponding to FIG. 3A.

FIG. 4A is a diagram showing a state of a change in an energy band of a depth direction along a line I—I of FIG. 3A. In the drawing, an energy level at the upper portion indicates a bottom of a conduction band, and an energy level at the lower portion indicates a top of a valence band.

Figure 5:
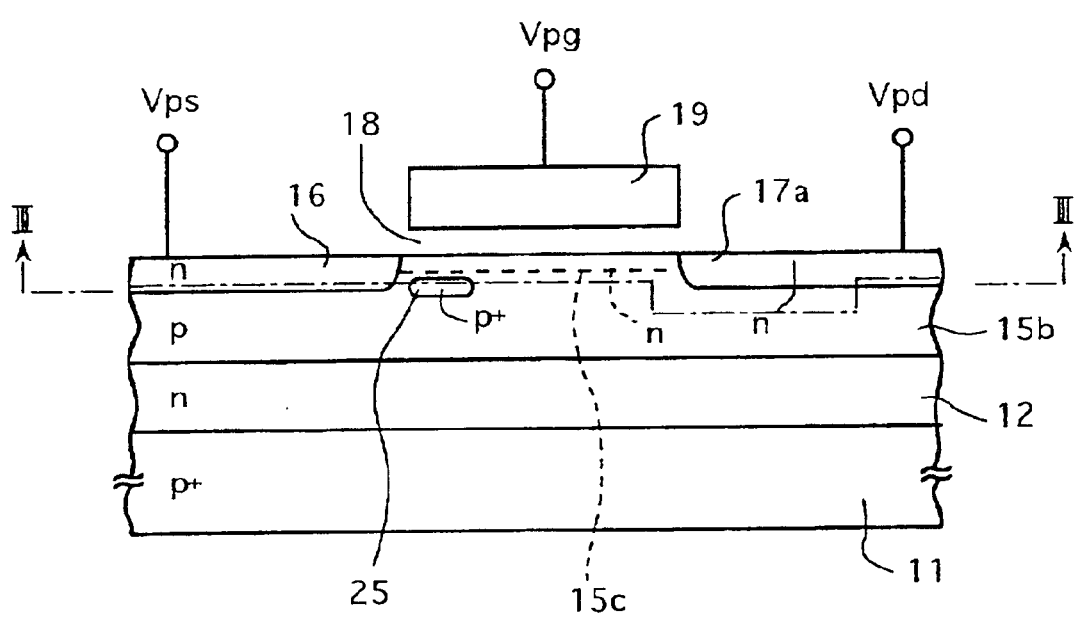
FIG. 5 is an element cross-sectional view of a MOSFET for optical signal detection, which explains the method of storing optically generated charges by an optical signal in a solid state imaging device according to the embodiment of the present invention.

FIG. 5 is an element cross-sectional view showing a state of the channel region of the MOSFET 112 portion and a peripheral portion thereof during the period B of FIG. 2.

Figure 6A:
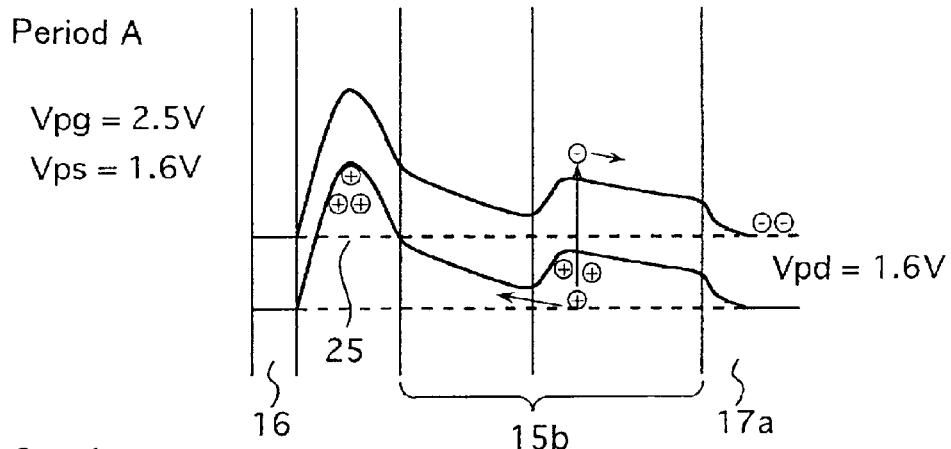
FIGS. 6A to 6C are views respectively showing states of changes in the energy band in a lateral direction (direction along a line III—III of FIG. 5) from a well region under a drain region through a well region under a channel region including a carrier pocket to a well region under a source region during a period A of a storing period, a period B and a reading-out period (period C).
Figure 6B:
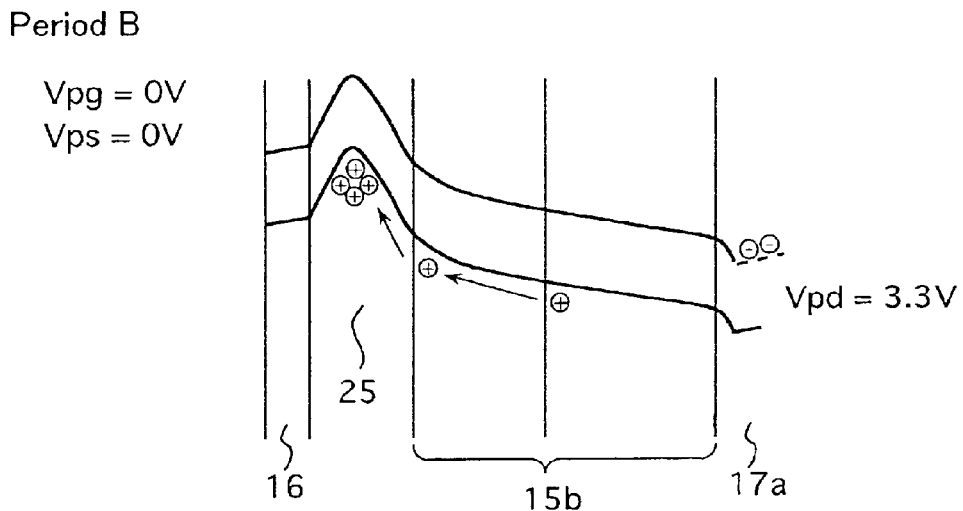
Figure 6C:
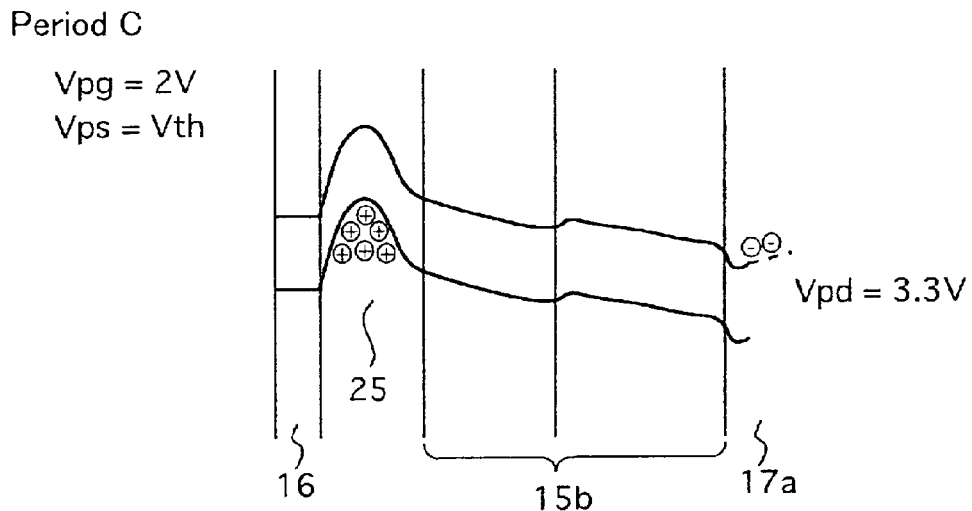

FIGS. 6A to 6C are views respectively showing states of changes in the energy band in a lateral direction (direction along the line III—III of FIG. 5) from the well region 15b under the drain region 17a through the well region 15b under the channel region including the carrier pocket 25 to the well region 15b under the source region 16 during the period A, the period B and the period C. In each of the drawings, the energy level at the upper portion indicates a bottom of a conduction band, and the energy level at the lower portion indicates a top of a valence band.

First, during the period A, the gate electrode 19 of the MOSFET 112 for optical signal detection is held at a positive potential, for example, +2.3 to 2.5 V, which is equal to a positive potential of the gate electrode 19 during the reading-out period C (hereinafter, sometimes referred to as a gate potential). The drain region 17a is held at a positive potential, for example, +1.6 V, such that a pn junction formed of the drain region 17a, the source region 16 and the well region 15b is reversely biased, the channel region is not depleted for the gate potential of +2.3 to 2.5 V, and electrons are accumulated with a sufficient density in the channel region. In addition, the source region 16 of the MOSFET 112 is isolated from an outside circuit such that a current does not flow through the channel region of the MOSFET 112.

This potential holding is carried out for the entire pixels irrespective of the selected rows for reading-out or the non-selected rows therefor.

Thus, as shown in FIGS. 3A and 4A, electrons of a sufficient density are accumulated in the channel region. Noted that, electrons accumulated in the channel region is to be supplied from the source region 16 and the drain region 17a. The source region 16 is connected to the drain region 17a through the channel region, and is held at a positive potential of about +1.6 V (VDD) equal to the positive potential in the drain region 17a. Thus, the first well region 15a, the second well region 15b and the epitaxial layer 12 are depleted.

Subsequently, the photo diode 111 is irradiated with lights to generate an electron and hole pair (optically generated charges). The optically generated holes among the optically generated charges are stored in the first well region 15a of the photo diode 111. At this time, the potential in the carrier pocket 25 for the holes is lower than the potential in the first and second well regions 15a and 15b in the peripheral portion. Accordingly, as shown in FIG. 6A, the optically generated holes stored in the first well region 15a are moved to the carrier pocket 25 and stored therein.

During the period A, the channel region is set in an accumulation state to store a sufficient amount of electrons. Thus, hole generating centers on the interface levels between the gate insulating film 18 and the channel region are maintained in a non-active state, and the discharge of the holes is prevented. In other words, since a leak current due to the discharge of the holes is suppressed, the storage of the holes other than the optically generated charges in the carrier pocket 25 is suppressed, thus the occurrence of a so-called white scratch on the image screen can be prevented.

In the case where the potential of the gate electrode 19 is held at 2.5 V and the potentials of the drain region 17a and the source region 16 are respectively held at 1.6 V such that the channel region is maintained in the accumulation state, as shown in FIG. 4A, the energy level on the surface of the p-type well region 15b is pushed down (the potential is raised), thus a difference of the energy levels (potentials) between the bottom of the carrier pocket 25 and the top thereof is reduced. The potentials of the gate electrode 19, the drain region 17a and the source region 16 are appropriately adjusted, thus the difference of the energy levels (potentials) in the carrier pocket 25 can be set at an appropriate height while the channel region is maintained in the accumulation state. Therefore, the amount of the optically generated holes stored in the carrier pocket 25 is appropriately maintained.

Next, during the period B, the output (Vpg) of the VSCAN driving scanning circuit 102 is maintained at a ground potential (which becomes the gate potential of the MOSFET 112). At the same time, the potentials of the VDD driving scanning lines 22a and 22b are maintained at a voltage of about 3.3 V (which becomes the drain potential of the MOSFET 112) such that the pn junctions formed between the drain region 17a and the well region 15b, and between the source region 16 and the well region 15b are reversely biased more deeply than that is biased during the period A. This potential holding is also carried out for all the pixels irrespective of the selected rows for reading-out or the non-selected rows therefor.

In such a manner, as shown in FIG. 6B, the channel region is maintained in the depletion state, and a stronger electric field going toward the carrier pocket 25 is generated in the well region 15b. Thus, the entire optically generated charges remaining in the well regions 15a and 15b are transferred to the carrier pocket 25 to be stored therein. In the carrier pocket 25, a negative charge amount of the acceptor, which corresponds to the charge amount of the stored optically generated charges, are neutralized. Thus, the potential of the charges in the vicinity of the source region 16 is modulated to change the threshold voltage of the depletion nMOSFET 112.

Next, the operation transfers to the reading-out period (period C). The potentials of the VDD driving scanning lines 22a and 22b are entirely kept to be held at a voltage of about 3.3 V (which becomes the drain potential of the MOSFET 112). At this time, as shown in FIG. 6C, an appropriate amount of holes enough not to generate a so-called smear are stored in the carrier pocket 25.

In the state as described above, the output (Vpg) of the VSCAN driving scanning circuit 102, which corresponds to the selected rows for reading-out, is set at a voltage of about 2.3 to 2.5 V (which becomes the gate potential of the MOSFET 112), and the output (Vpg) of the VSCAN driving scanning circuit 102, which corresponds to the non-selected rows for reading-out, is set at a ground potential. In other words, the potential of the gate electrode 19 is held at a voltage of about 2 to 3 V and the potential of the drain region 17a is held at a VDD potential of about 3.3 V such that the MOSFETs 112 arrayed in the selected rows for reading-out can be operated in a saturated state. Therefore, a high electric field region is formed in the channel region close to the drain region 17a, and an accumulation region of a low electric field is formed in a part of the channel region above the carrier pocket 25 close to the source region 16.

Subsequently, the source potentials corresponding to the modulation of the threshold voltage due to the optically generated charges are sequentially stored in the memories of the signal output circuit 105, which are connected to the source regions 16 of the MOSFETs 112 arrayed in the selected rows for reading-out.

Thereafter, the operation returns to the storing period through the initializing operation. During the storing period, the output timing is controlled according to the signal inputted to the signal output circuit 105 from the HSCAN input scanning circuit 104. Thus, the video signal (Vout) proportional to the amount of irradiated light, which is stored in the signal output circuit 105 during the previous period, can be sequentially taken out.

As described above, according to the embodiment of the present invention, during the storing period A, the optically generated holes are transferred to the carrier pocket 25 to be stored therein, while movable electrons are accumulated in the channel region of the MOSFET 112 for optical signal detection to maintain the channel region in the accumulation state so that the discharge of the holes trapped on the interface levels is prevented.

Thus, since the leak current due to the discharge of the holes from the interface level is suppressed during the storing period, the storage of the holes other than the optically generated charges in the carrier pocket 25 is suppressed, thus the occurrence of a so-called white scratch on the video screen can be prevented.

In addition, since the amount of the optically generated holes stored in the carrier pocket 25 can be held appropriately, a so-called smear on the video screen can be prevented.

COMPARATIVE EXAMPLE

Hereinbelow, description will be made for a method of storing optically generated charges by an optical signal according to a comparative example with reference to FIG. 3B and FIG. 4B.

Figure 1:
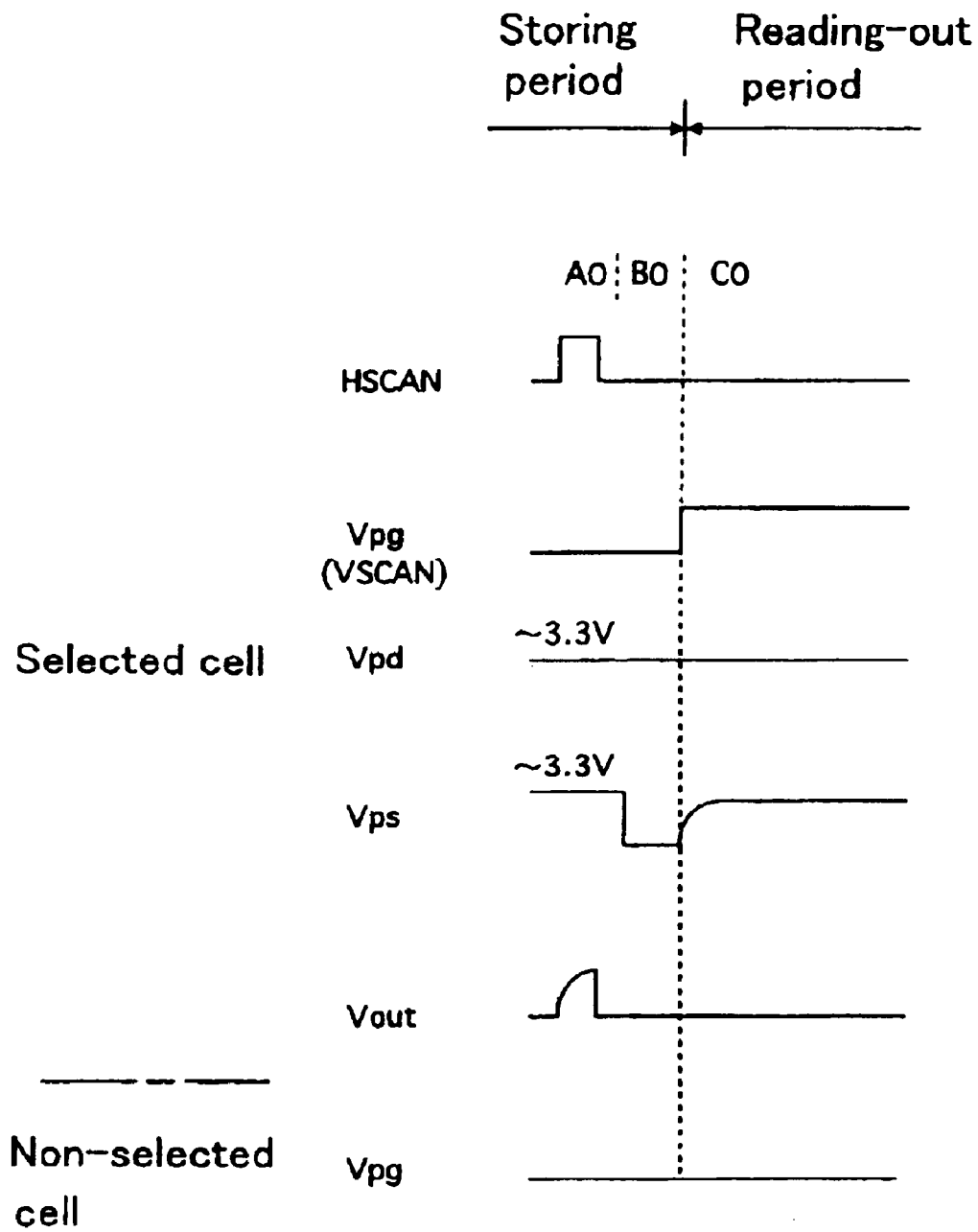
FIG. 1 is a timing chart showing a method of storing optically generated charges by an optical signal in a solid state imaging device in the conventional example.
Figure 3B:
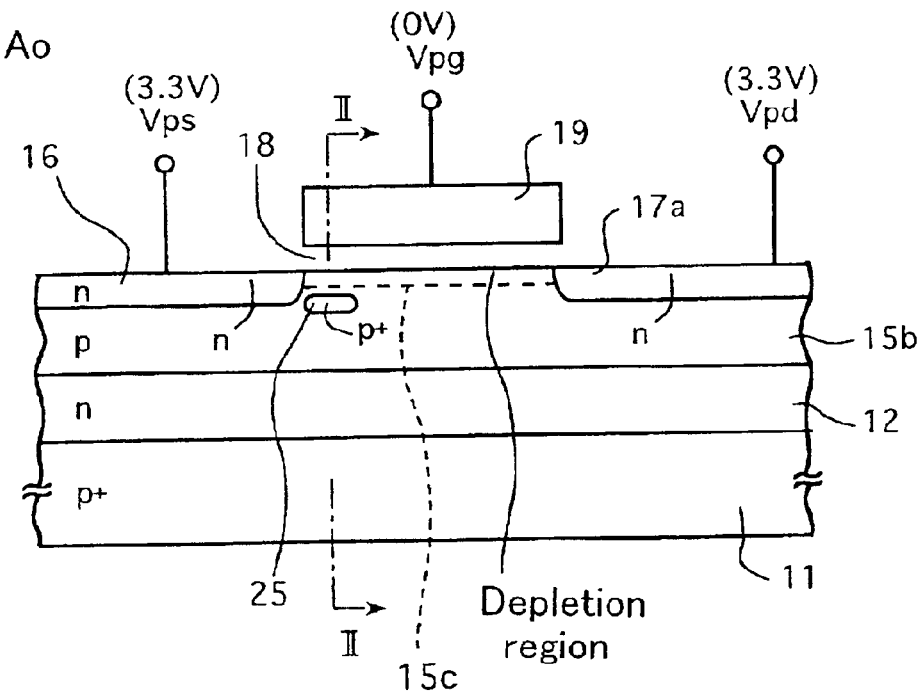
FIG. 3B is a cross sectional view showing a state of a peripheral portion of a channel region during a period A0 of a storing period in the method of storing optically generated charges by an optical signal in FIG. 1, the cross sectional view according to a comparative example.
Figure 4B:
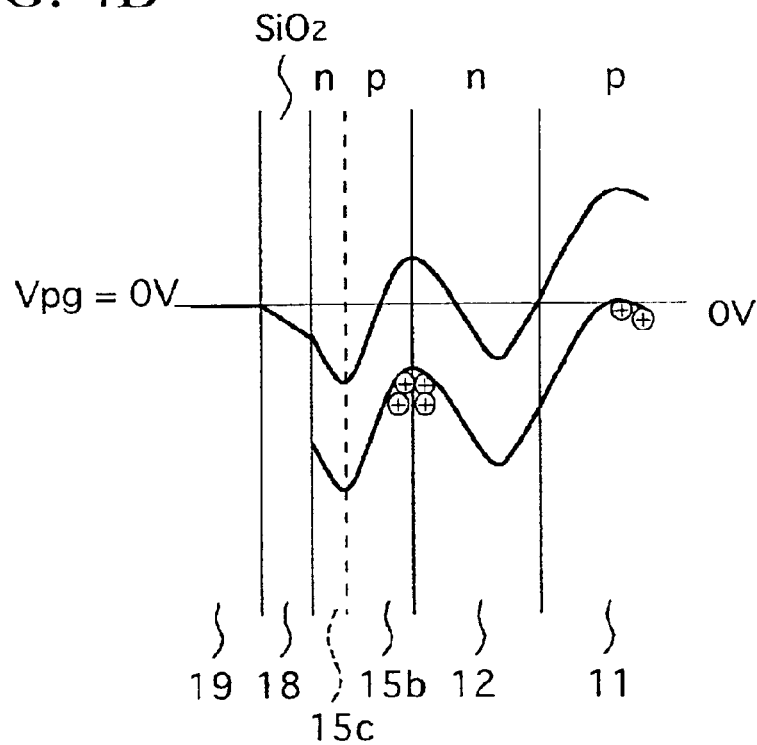
FIG. 4B is a graph showing a state of a change in an energy band of a depth direction, the graph corresponding to FIG. 3B.

FIG. 3B is a cross-sectional view showing a state of the channel region of the MOSFET and a peripheral portion thereof during a storing period A0 of FIG. 1 according to the comparative example. FIG. 4B is a view showing a state of a change in an energy band of a depth direction along a line II—II.

Since the gate potential is a ground potential during the storing period A0, and is lower than the source potential and the drain potential, the channel region comes in a depletion state. Accordingly, since the interface levels in the channel region are covered with a depletion layer, there is a fear that the trapped holes are discharged from the interface level and the discharged holes are stored in the carrier pocket 25. In addition, there is a fear that the optically generated holes during the transfer into the carrier pocket 25 are trapped onto the interface levels. Therefore, there comes a fear that the optical signal detection cannot be performed with high precision.

The present invention has been described above in detail along the embodiment. However, the scope of the present invention is not limited to the example concretely illustrated in the above-described embodiment, and modifications of the above-described embodiment without departing from the gist of the present invention are included in the scope of the present invention.

For example, in the above-described embodiment, in order to make the accumulation state of the channel region during the storing period, the potentials are held in the drain region 17a and the source region 16 such that, particularly, the pn junctions formed between the drain region 17a and the well region 15b, and between the source region 16 and the well region 15b are reversely biased. However, depending on cases, the drain region 17a and the source region 16 may be held at a ground potential to make the foregoing pn junction zero-bias.

Furthermore, various variations of examples can be conceived as structures of the solid state imaging device to which the present invention is applied. However other structures may be, it is sufficient that the photo diode 111 and the MOSFET 112 for optical signal detection may constitute the unit pixel while being adjacent to each other, and that the carrier pocket (high-density buried layer) 25 may be provided in the vicinity of the source region 16 within the p-type well region 15b under the channel region of the MOSFET 112.

Still further, the p-type substrate 11 is used, but instead, an n-type substrate may be used. In this case, in order to obtain an effect similar to that of the above-described embodiment, it is sufficient that the conductivity types of the respective layers and regions that have been described in the embodiment may be reversed.

In other words, the well regions and the carrier pocket are of an n-type, the carrier pocket becomes an electron pocket, and the carriers to be stored in the carrier pocket are electrons between the two, which are electrons and holes. Then, p-type impurities are introduced to the channel region (p-channel region) to form a channel doped layer, and during the transfer or storage of the optically generated charges into the carrier pocket, sufficient charges of a conductivity type reverse to that of the well region, that is, sufficient holes are stored in the channel doped layer.

Moreover, when the potentials of the gate electrode, the drain region and the source region are held such that the channel region is maintained to be in a state where the movable holes are accumulated, a potential difference between a bottom of the potential of the carrier pocket and a top thereof is lowered. Accordingly, the potentials of the gate electrode, the drain region and the source region are adjusted to maintain the channel region in the accumulation state, and the potential of the carrier pocket is set so as to have an appropriate height, thus the amount of the optically generated electrons stored in the carrier pocket can be held appropriately. Therefore, a so-called smear on the video screen can be prevented.

As described above, according to the present invention, the channel region is set in an accumulation state at least during the transfer of the optically generated charges such that the optically generated charges transferred from the photo diode to the carrier pocket and stored therein are not affected by the charges trapped on the interface levels in the channel region.

In such a manner, the channel region is maintained in the accumulation state, thus the charge generating centers on the interface levels in the channel region are maintained in a non-active state, and the discharge of the charges from the interface levels is prevented. In other words, since the leak current is suppressed, the storage of the charges other than the optically generated charges into the carrier pocket is suppressed, thus the occurrence of a so-called white scratch on the video screen can be prevented.

In this case, preferably an accumulation state of electrons may be formed in a surface layer over the entire well region by forming at least the photo diode of a buried structure.

Moreover, in the case where the potentials of the gate electrode, the drain region and the source region are held such that the channel region is maintained in the accumulation state, the difference of the potentials between the bottom of the carrier pocket and the top thereof can be set so as to have an appropriate height, thus the amount of the optically generated charges stored in the carrier pocket can be appropriately held to prevent a so-called smear on the video screen.

What is claimed is:

1. A method of storing charges generated by an optical signal in a solid state imaging device comprising the steps of:
   (i) preparing the solid state imaging device comprising a unit pixel including
      (a) a photo diode provided with
         (1) a semiconductor layer of a first conductivity type, and
         (2) an impurity region of a second conductivity type formed on a surface layer of the semiconductor layer so that the photo diode has a buried structure, and
      (b) a field effect transistor for optical signal detection formed in the semiconductor layer adjacently to the photo diode, provided with
         (1) a source region of the second conductivity type formed on the semiconductor layer,
         (2) a drain region of the second conductivity type formed on the semiconductor layer and connected to the impurity region,
         (3) a channel region formed on the surface layer of the semiconductor layer between a source region and a drain region,
         (4) a gate electrode formed covering the entire channel region by interpolating a gate insulating film, and
         (5) a carrier pocket of a high-density buried layer of the first conductivity type provided in the semiconductor layer under the channel region;
   (ii) generating optically generated charges in the photo diode by light irradiation;
   (iii) transferring the optically generated charges to the carrier pocket while accumulating movable charges of the same conductivity type as that of the source region over the entire channel region by means of a potential of the gate electrode; and
   (iv) storing the optically generated charges in the carrier pocket while accumulating movable charges of the same conductivity type as that of the source region over the entire channel region by means of a potential of the gate electrode.

2. The method of storing charges generated by an optical signal in a solid state imaging device according to claim 1, wherein the field effect transistor for optical signal detection is a depletion type.

3. The method of storing charges generated by an optical signal in a solid state imaging device according to claim 1, wherein movable charges of the same conductivity type as that of the source region are accumulated over an entire surface layer of the semiconductor layer including the channel region at least in the steps of transferring and storing.

4. The method of storing charges generated by an optical signal in a solid state imaging device according to claim 1, wherein a current is flowed to the field effect transistor for optical signal detection to read out a change in a threshold voltage after a period when the optically generated charges are transferred to the carrier pocket to be stored therein.

5. A method of storing charges generated by an optical signal in a solid state imaging device comprising the steps of:
   (i) preparing the solid state imaging device comprising a unit pixel including
      (a) a photo diode provided with
         (1) a first semiconductor layer of a first conductivity type, and
         (2) an impurity region of a second conductivity type formed on a surface of the first semiconductor layer so that the photo diode has a buried structure, and
      (b) a field effect transistor for optical signal detection placed adjacently to the photo diode, provided with
         (1) a second semiconductor layer of the first conductivity type connected to the first semiconductor layer,
         (2) a source region of the second conductivity type formed on the second semiconductor layer,
         (3) a drain region of the second conductivity type formed on the second semiconductor layer and connected to the impurity region, (4) a channel region formed on a surface layer of the second semiconductor layer between the source region and the drain region, (5) a channel doped layer of the second conductivity type formed on the channel region, (6) a gate electrode formed covering the entire channel region by interpolating a gate insulating film, and (7) a carrier pocket of the first conductivity type being provided in the second semiconductor layer under the channel region in the vicinity of a source region;

(ii) generating optically generated charges in the photo diode by light irradiation;

(iii) transferring the optically generated charges to the carrier pocket while accumulating movable charges of the second conductivity type over the entire channel region by means of a potential of the gate electrode; and (iv) storing the optically generated charges in the carrier pocket while accumulating movable charges of the second conductivity type over the entire channel region by means of a potential of the gate electrode.

6. The method of storing charges generated by an optical signal in a solid state imaging device according to claim 5, wherein the field effect transistor for optical signal detection is a depletion type.

7. The method of storing charges generated by an optical signal in a solid state imaging device according to claim 5, wherein movable charges of the second conductivity type are accumulated over an entire surface layer of the first and second semiconductor layers including the channel region at least in the steps of transferring and storing.

8. The method of storing charges generated by an optical signal in a solid state imaging device according to claim 5, wherein a current is flowed to the field effect transistor for optical signal detection to read out change in a threshold voltage after a period when the optically generated charges are transferred to the carrier pocket to be stored therein.

9. The method of storing charges generated by an optical signal in a solid state imaging device according to claim 5, further comprising a plurality of the pixels arranged in rows and columns, wherein the optical signals are stored in the respective pixels by supplying different scanning signals to the mutually connected gate electrodes of the field effect transistors arrayed in the same row, the mutually connected drain regions of the field effect transistors arrayed in the same row, and the mutually connected source regions of the field effect transistors arrayed in the same column.

10. The method of storing charges generated by an optical signal in a solid state imaging device according to claim 9, wherein the storing of the optical signals into the respective pixels and the reading-out of the stored optical signals are controlled by a vertical scanning signal driving scanning circuit for supplying a scanning signal to the gate electrodes in the raw, a drain voltage driving scanning circuit for supplying a drain voltage to the drain regions in the raw, a signal output circuit for storing voltages of the source regions in the column and further outputting an optical signal corresponding to the voltage of the each source region, and a horizontal scanning signal input scanning circuit for supplying a scanning signal for controlling a timing of reading out the optical signal.

* * * * *